United States Patent
Romero et al.

(10) Patent No.: US 11,143,732 B2
(45) Date of Patent: Oct. 12, 2021

(54) MAGNETIC FIELD SENSOR WITH MODULATED DIAGNOSTIC SIGNAL

(71) Applicant: Allegro MicroSystems, LLC, Manchester, NH (US)

(72) Inventors: Hernán D. Romero, Buenos Aires (AR); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 340 days.

(21) Appl. No.: 15/901,135

(22) Filed: Feb. 21, 2018

(65) Prior Publication Data
US 2019/0257909 A1    Aug. 22, 2019

(51) Int. Cl.
| | | |
|---|---|---|
| *G01R 35/00* | (2006.01) | |
| *G01R 33/00* | (2006.01) | |
| *G01R 33/07* | (2006.01) | |
| *G01R 33/09* | (2006.01) | |
| *G01D 5/14* | (2006.01) | |

(Continued)

(52) U.S. Cl.
CPC ........... *G01R 35/007* (2013.01); *G01D 5/142* (2013.01); *G01D 5/16* (2013.01); *G01D 18/00* (2013.01); *G01R 33/0094* (2013.01); *G01R 33/07* (2013.01); *G01R 33/09* (2013.01)

(58) Field of Classification Search
CPC ...... G01R 35/007; G01R 33/09; G01R 33/07; G01R 33/0094; G01D 5/16; G01D 5/142; G01D 18/00
See application file for complete search history.

(56) References Cited

U.S. PATENT DOCUMENTS

| | | | |
|---|---|---|---|
| 5,594,173 A | * | 1/1997 | Frey ........................ G01P 21/02 |
| | | | 324/173 |
| 7,705,586 B2 | | 4/2010 | Van Zon et al. |

(Continued)

FOREIGN PATENT DOCUMENTS

EP    1797496    7/2009

OTHER PUBLICATIONS

U.S. Appl. No. 15/606,358, filed May 26, 2017, Latham et al.
(Continued)

*Primary Examiner* — Douglas X Rodriguez
*Assistant Examiner* — Haidong Zhang
(74) *Attorney, Agent, or Firm* — Daly, Crowley, Mofford & Durkee, LLP (57) ABSTRACT

A magnetic field sensor comprises a first coil configured to generate a magnetic field having a first frequency and induce a reflected magnetic field from a target. A second coil configured to generate a diagnostic magnetic field having a second frequency is included. The diagnostic magnetic field is configured not to induce a reflected magnetic field from the target that is measurable by the magnetic field sensor. At least two magnetic field sensing elements detect the reflected magnetic field and the diagnostic magnetic field and generate a signal representing the reflected magnetic field and the diagnostic magnetic field. A processing circuit is coupled to the at least two magnetic field sensing elements and configured to receive the signal, extract a diagnostic magnetic field portion of the signal representing the diagnostic magnetic field, and generate an error signal if a fault is detected.

22 Claims, 7 Drawing Sheets

(51) Int. Cl.
    *G01D 18/00*     (2006.01)
    *G01D 5/16*     (2006.01)

(56)     References Cited

U.S. PATENT DOCUMENTS

| | | |
|---|---|---|
| 7,800,389 B2 | 9/2010 | Friedrich et al. |
| 8,447,556 B2 | 5/2013 | Friedrich et al. |
| 2007/0247141 A1* | 10/2007 | Pastre .................. G01R 33/075 324/202 |
| 2015/0022193 A1 | 1/2015 | Burdette et al. |
| 2015/0022198 A1* | 1/2015 | David .................. G01D 5/2013 324/251 |
| 2016/0139199 A1* | 5/2016 | Petrie .................... G01R 33/07 324/750.3 |

OTHER PUBLICATIONS

U.S. Appl. No. 15/606,362, filed May 26, 2017, Latham et al.
U.S. Appl. No. 15/606,332, filed May 26, 2017, Latham et al.
U.S. Appl. No. 15/606,325, filed May 26, 2017, Romero.
U.S. Appl. No. 15/782,163, filed Oct. 12, 2017, Cook et al.
U.S. Appl. No. 15/606,352, filed May 26, 2017, Latham et al.
U.S. Appl. No. 15/606,262, filed May 26, 2017, Latham et al.

\* cited by examiner

MAGNETIC FIELD SENSOR WITH MODULATED DIAGNOSTIC SIGNAL

FIELD

This disclosure relates to magnetic field sensors and, more particularly, magnetic field sensors including self-diagnostic circuits.

BACKGROUND

Magnetic field sensors are often used to detect motion, position, speed, or other attributes of an object. For example, magnetic field sensors may be used to detect the position and motion of a robotic arm or may be used to detect the state of a transmission system or anti-lock braking system. Many applications require the magnetic field sensors to meet rigorous safety standards so that failures can be detected and avoided. The automotive industry, in particular, often requires magnetic field sensors used in vehicles to continuously or periodically perform self-diagnostic tests to determine if they are operating properly.

SUMMARY

In an embodiment, a magnetic field sensor comprises a first coil configured to generate a magnetic field having a first frequency, wherein the magnetic field induces a reflected magnetic field from a target. A second coil configured to generate a diagnostic magnetic field having a second frequency is included, wherein the diagnostic magnetic field is configured not to induce a reflected magnetic field from the target that is measurable by the magnetic field sensor. At least two magnetic field sensing elements detect the reflected magnetic field and the diagnostic magnetic field and generate a signal representing the reflected magnetic field and the diagnostic magnetic field. A processing circuit is coupled to the at least two magnetic field sensing elements and configured to: receive the signal, extract a diagnostic magnetic field portion of the signal representing the diagnostic magnetic field, and generate an error signal if the diagnostic magnetic field portion of the signal represents a fault.

In another embodiment, a magnetic field sensor comprises a coil configured to generate a magnetic field having a first frequency, wherein the magnetic field induces a reflected magnetic field from a target. The magnetic field sensor includes means for generating a diagnostic magnetic field having a second frequency, wherein the diagnostic magnetic field does not induce a reflected magnetic field from the target that is measurable by the magnetic field sensor. The magnetic field sensor also includes means for detecting the reflected magnetic field and the diagnostic magnetic field and generating a signal representing the reflected magnetic field and the diagnostic magnetic field, and means for extracting a portion of the signal representing the diagnostic magnetic field.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

In this disclosure, the term "magnetic field sensing element" is used to describe a variety of electronic elements that can sense a magnetic field. The magnetic field sensing element can be, but is not limited to, a Hall Effect element, a magnetoresistance element, or a magnetotransistor. There are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. Planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

In this disclosure, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

In this disclosure, the term "target" is used to describe an object to be sensed or detected by a magnetic field sensor or magnetic field sensing element. In embodiments, the target may be a ferromagnetic or non-magnetic target, and may be formed from a conductive or a non-conductive material.

Figure 1:
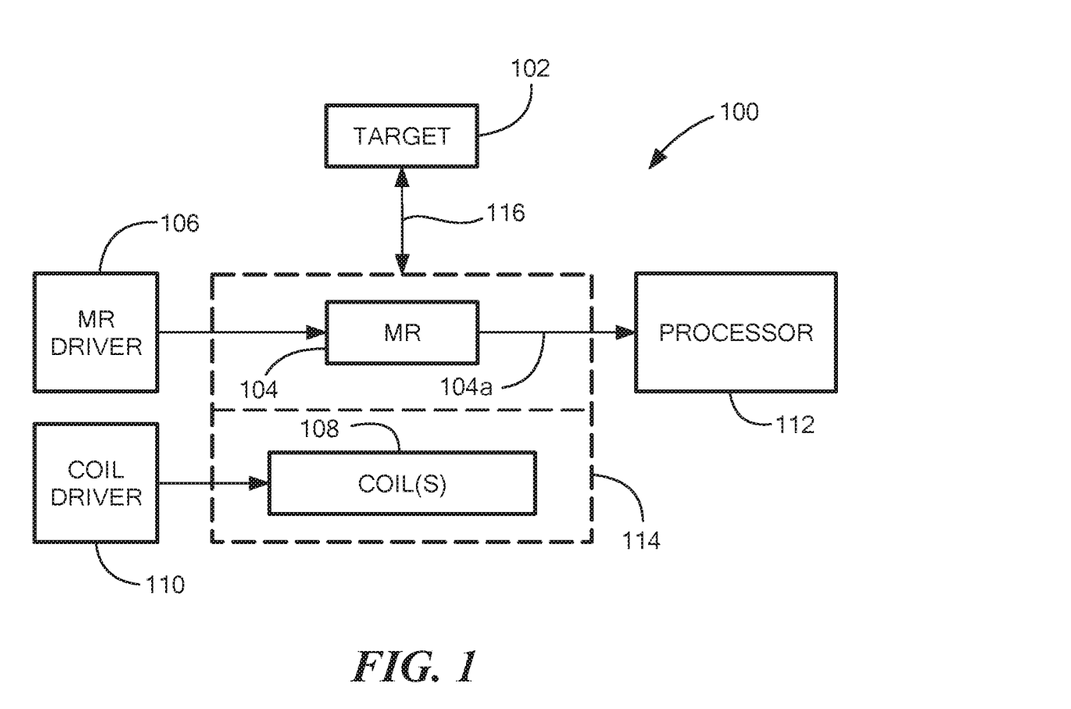
FIG. 1 is a block diagram of a magnetic field sensor for detecting a reflected magnetic field induced in a target.

FIG. 1 is a block diagram of a system 100 for detecting a conductive target 102. Target 102 may be magnetic or non-magnetic in various embodiments. System 100 includes one or more magnetoresistance (MR) elements 104 and an MR driver circuit 106. MR driver circuit 106 may include a power supply or other circuit that provides power to MR elements 104. In embodiments, MR elements 104 may be replaced with other types of magnetic field sensing elements such as Hall effect elements, etc. MR elements 104 may comprise a single MR element or multiple MR elements. The MR elements may be arranged in a bridge configuration, in certain embodiments.

System 100 may also include one or more coils 108 and a coil driver circuit 110. Coils 108 may be electrical coils, windings, wires, traces, etc. configured to generate a magnetic field when current flows through the coils 108. In embodiments, coils 108 comprise two or more coils, each a conductive trace supported by substrate, such as a semiconductor substrate, a glass substrate, a ceramic substrate, or the like. In other embodiments, coils 108 may not be supported by a substrate. For example, coils 108 may be supported by a chip package, a frame, a PCB, or any other type of structure that can support traces of a coil. In other embodiments, coils 108 may be free standing wire, i.e. not supported by a separate supporting structure.

Coil driver 110 is a power circuit that supplies current to coils 108 to generate the magnetic field. In an embodiment, coil driver 110 may produce an alternating current so that coils 108 produce alternating magnetic fields (i.e. magnetic fields with magnetic moments that change over time). Coil driver 110 may be a circuit implemented, in whole or in part, on the semiconductor die.

System 100 may also include processor 112 coupled to receive signal 104a from MR elements 104, which may represent the magnetic field as detected by MR elements 104. Processor 112 may receive signal 104a and use it to determine a position, speed, direction, or other property of target 102.

MR elements 104 and coils 108 may be positioned on substrate 114. Substrate 114 may comprise semiconductor substrates, such as silicon substrates, a chip package, PCB or other type of board-level substrates, or any type of platform that can support MR elements 104 and coils 108. Substrate 114 may include a single substrate or multiple substrates, as well as a single type of substrate or multiple types of substrates.

In operation, MR driver 106 provides power to MR elements 104 and coil driver 110 provides current to coils 108. In response, at least one coil produces a magnetic field that is affected by movement of the target to generate a detectable magnetic field.

As target 102 moves in relation to the magnetic field, its position and movement through the field changes the field. In response, signal 104a produced by MR elements 104 changes. Processor 112 receives signal 104a and processes the changes in (and/or the state of) the signal to determine position, movement, or other characteristics of target 102. In an embodiment, system 100 can detect movement or position of target 102 along axis 116. In other words, system 100 may detect the position of target 102 in proximity to MR elements 104 as target 102 moves toward or away from MR elements 104 and coils 108 (or as the substrate 114 moves toward or away from target 102). System 100 may also be able to detect other types of position or movement of target 102. Examples of similar systems may be found in U.S. patent application Ser. No. 15/606,358 (filed May 26, 2017), which is incorporated here by reference in its entirety.

Figure 2:
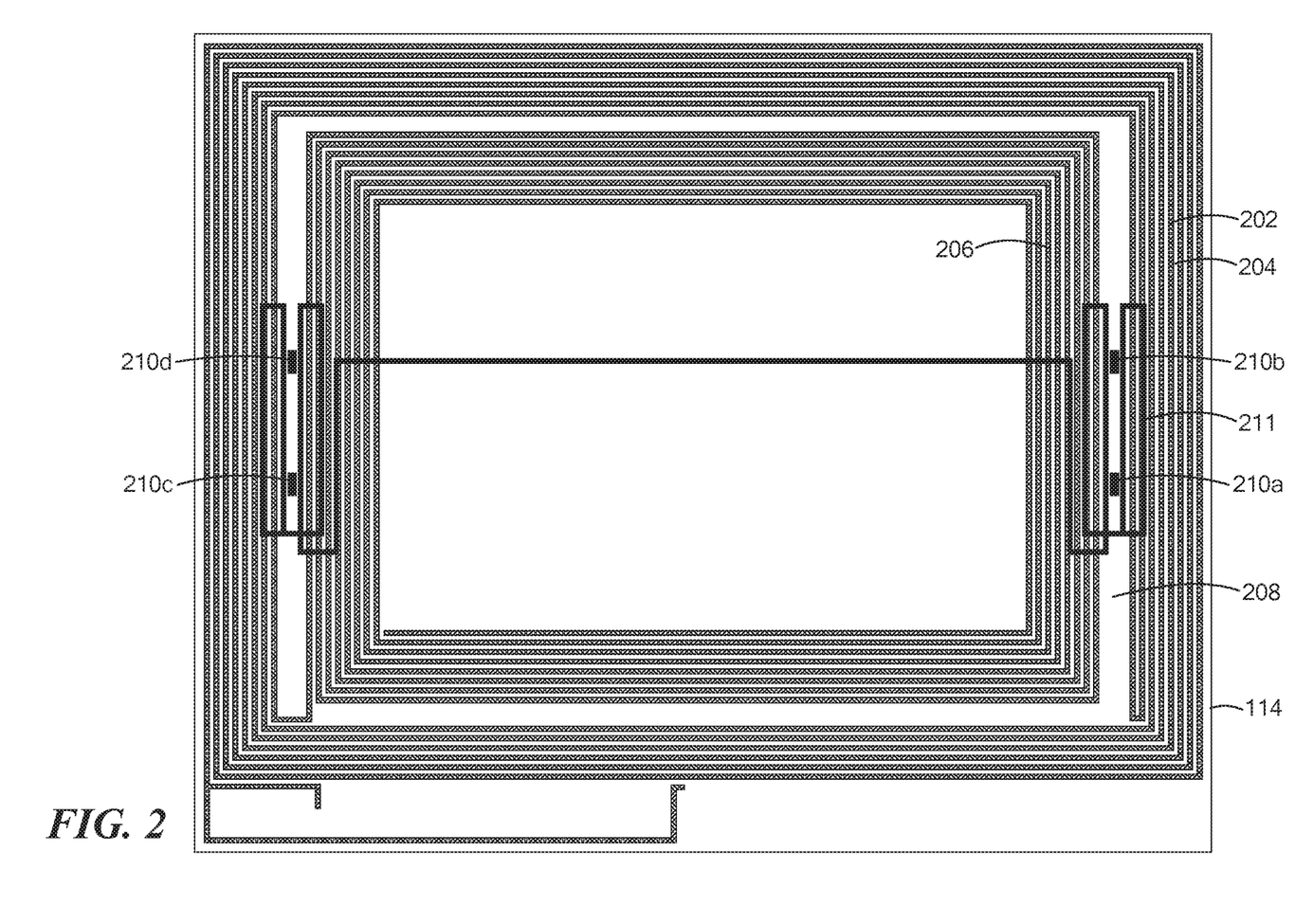
FIG. 2 is a layout diagram of coils and magnetic field sensing elements on a substrate.

FIG. 2 is a substrate layout diagram showing an embodiment of substrate 114 and one or more coils (such as coil 108). A first coil 202 may be configured to induce a reflected magnetic field in a target. Coil 202 may include an outer portion 204 and an inner portion 206 with a gap 208 between the inner and outer portions. One or more magnetic field sensing elements 210a-210d may be positioned in or near gap 208.

When an AC current passes through the windings of coil 202, it generates a magnetic field. The magnetic field may interact with a conductive target (e.g. target 102 in FIG. 1). The AC magnetic field may induce eddy currents within target 102. These eddy currents may, in turn, generate their own magnetic field, which can be detected by magnetic field sensing elements 210a-210d. The magnetic field generated by the eddy currents may be referred to as a reflected field.

A second coil 211 may be configured to produce a local field that does not induce a measurable reflected field. Rather, the local field may be directly detected by magnetic field sensing elements 210a-210d.

Figure 3:
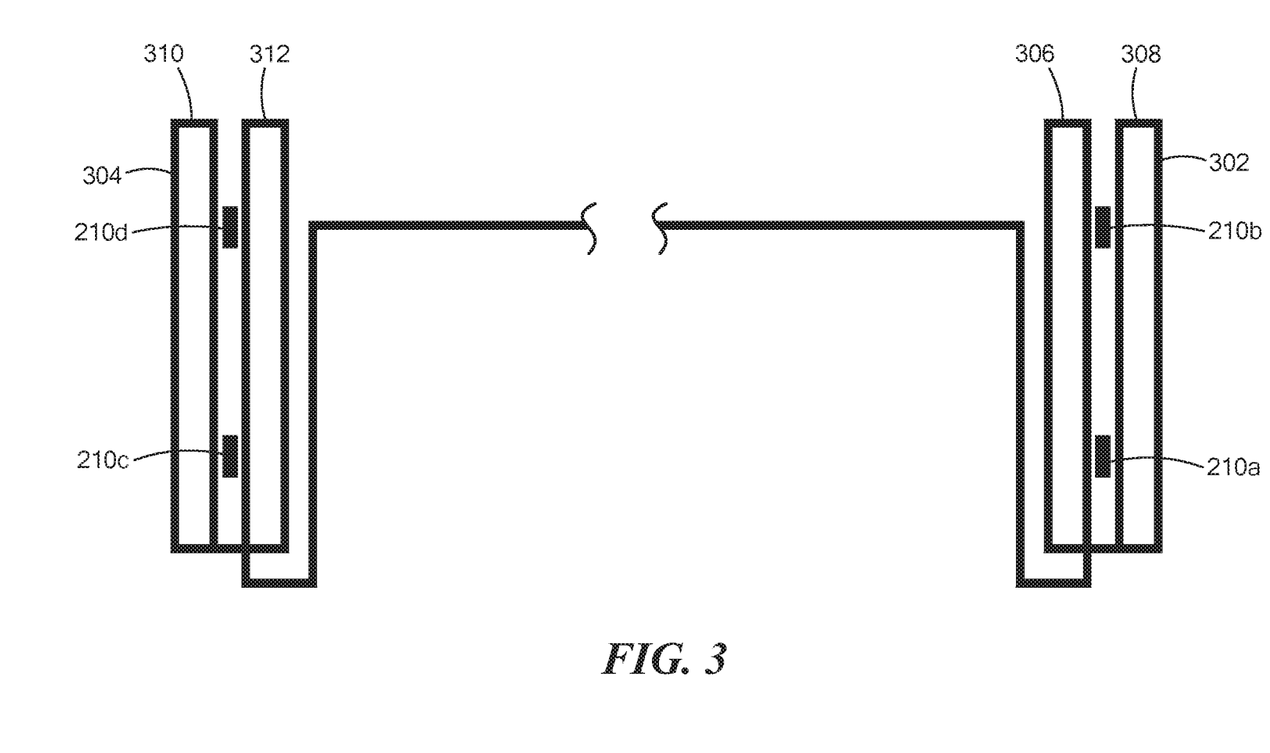
FIG. 3 is a layout diagram of coils and magnetic field sensing elements on a substrate.

FIG. 3 is a substrate layout diagram showing second coil 211. Coil 211 may include one or more lobes 302 and 304 positioned on opposite sides of coil 202. The lobes may be positioned in or adjacent to gap 208.

Each lobe 302 and 304 may include two or more windings (e.g. loops). As shown, lobe 302 includes windings 306 and 308, and lobe 304 includes windings 310 and 312. The current through adjacent windings may flow in opposite directions. For example, current through winding 306 may flow in a clockwise direction while current through winding 308 may flow in a counter-clockwise direction, or vice versa. In other embodiments, current through adjacent windings may flow in the same direction.

In embodiments, magnetic field sensing elements 210a-210d may be placed in the space between adjacent windings. In this arrangement, the magnetic field sensing element may experience a local magnetic field that can be represented by the vector sum of the magnetic field produced by each winding. For example, magnetic field sensing element 210a may experience a local field that is the vector sum of the magnetic field produced by winding 306 and the magnetic field produced by winding 308.

In embodiments, coil 211 does not induce eddy currents or a reflected magnetic field. In embodiments, the magnitude of any eddy currents or reflected magnetic field that is induced by coil 211 may be so small that it is not detectable by magnetic field sensing elements 210a-210d. This can be accomplished using a variety of techniques, either alone or in combination. For example, the size of coil 211 may be relatively small compared to coil 202. Additionally or alternatively, the current that flows through coil 211 may be relatively small so that the magnetic field produced by coil 211 is not strong enough to induce any significant or measurable reflected field from the target. Additionally or alternatively, if the current in windings 306 and 308 flows in opposite directions, the opposing magnetic fields may cancel each other out in the far field region so that they do not induce an eddy current in the target. In this arrangement, the opposing magnetic fields may not cancel each other out in the near field region so that the magnetic field can be detected by the magnetic field sensing elements. Additionally or alternatively, the frequency of current through coil 211 may be zero or low enough so that it does not induce any significant or measurable reflected field from the target.

In embodiments, the current through coil 202 may have a different frequency than the current through coil 211 so that the reflected field induced by coil 202 and detected by the magnetic field sensing elements has one frequency, and the directly coupled field generated by coil 211 and measured directly by the magnetic field sensing elements has another frequency. Thus, the output signal produced by the magnetic field sensing elements may include a frequency component representing the reflected field and another frequency component representing the directly coupled field.

In embodiments, windings 306, 308, 310, and 312 are connected in series so that the same current flows through the windings. As noted above, the current may flow in different directions in each winding.

Figure 4:
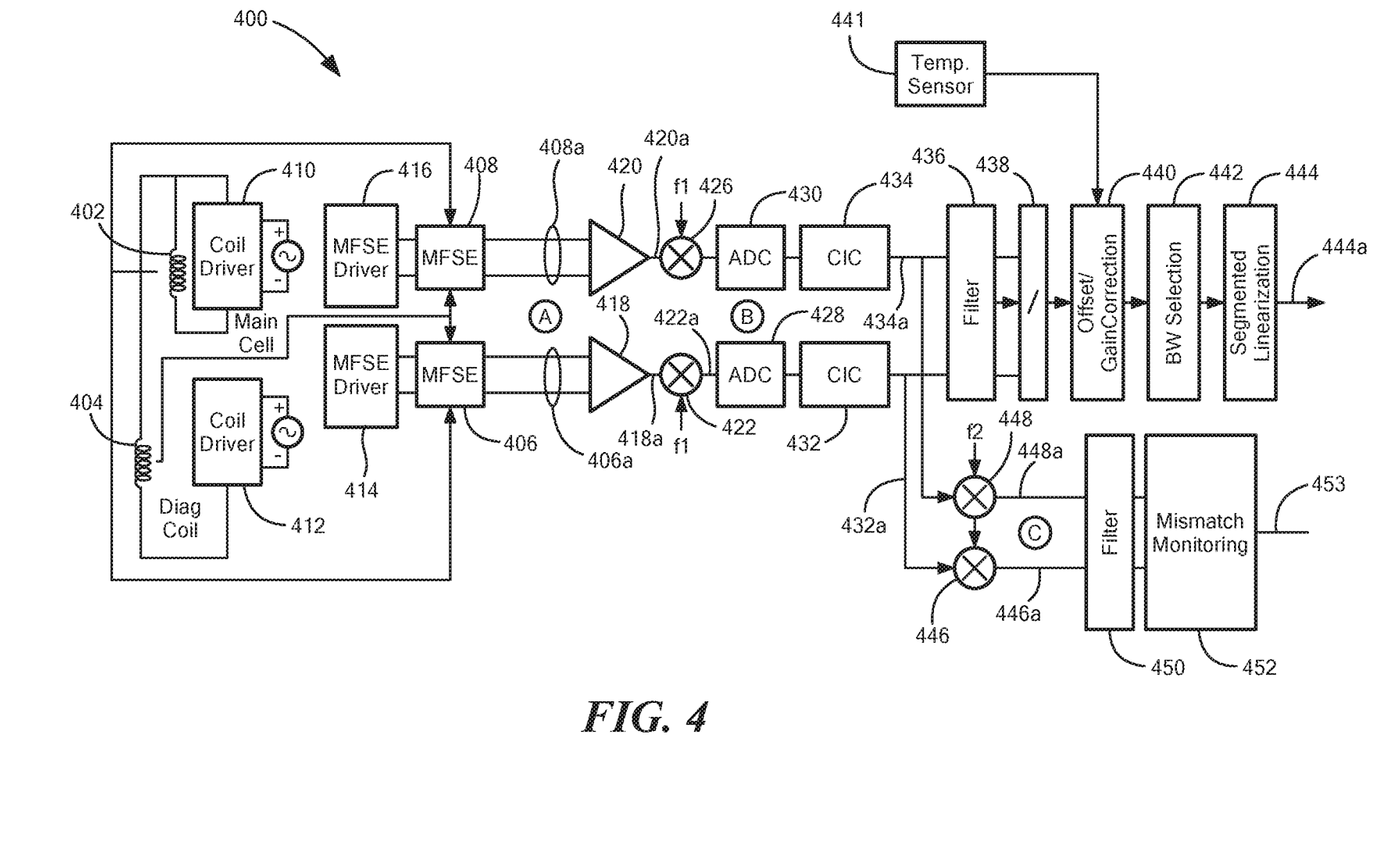
FIG. 4 is a block diagram of a magnetic field sensor including self-diagnostic circuitry.

FIG. 4 is a block diagram of a magnetic field sensor 400. Magnetic field sensor 400 includes a first coil 402 and a second coil 404. Coil 402 may be the same as or similar to coil 202 and may be configured to induce a reflected magnetic field in a target. Coil 404 may be the same as or similar to coil 211 and may be configured to produce a directly coupled magnetic field that can be sensed directly by magnetic field sensing elements 406 and/or 408. In embodiments, like coil 211, coil 404 may be configured so it does not induce a measurable reflected magnetic field from the target.

Sensor 400 includes coil driver 410 that supplies an AC current having frequency f1 to coil 402. In response, coil 402 may produce an AC magnetic field having frequency f1, which may induce a reflected magnetic field from the target having a frequency f1. Similarly, coil driver 412 supplies an AC current having frequency f2 to coil 404. In response, coil 404 may produce an AC magnetic field having a frequency of f2. Magnetic field sensing elements 406 and 408 may detect the reflected field having the frequency f1 and the magnetic field having the frequency f2 and produce respective signals 406a and 408a. These signals may include a frequency components at f1 representing the reflected field from the target and a frequency component at f2 representing the magnetic field produced by coil 404. In embodiments, frequency f1 and f2 may be different frequencies.

Magnetic field sensor 400 may also include magnetic field sensing element driver circuits 414 and 416 to provide power to magnetic field sensing elements 406 and 408, respectively, and amplifiers 418 and 420 to amplify signals 406a and 408a, respectively, and produce amplified signals 418a and 420a.

Modulator 422 may receive signal 418a and modulate it at the frequency f1. This may shift the frequency component of signal 418a (i.e. the frequency component representing the reflected magnetic field) to approximately zero Hertz. It may also shift other frequency components, such as noise, to frequencies around f1 and the frequency component at frequency f2 representing the directly coupled field, to frequencies around $\Delta f$, where $\Delta f$ is the difference between f1 and f2 (i.e. $\Delta f=|f1-f2|$). Similarly, modulator 426 may receive signal 420a and modulate it at the frequency f1. This may shift the frequency component of signal 420a (i.e. the frequency component representing the reflected magnetic field) to approximately zero Hertz. It may also shift other frequency components of the signal, such as noise, to frequencies around f1 and the frequency component at frequency f2 representing the directly coupled field, to frequencies around $\Delta f$.

Analog-to-digital converters (ADCs) 428 and 430 may convert signals 422a and 426a from analog to digital signals. In embodiments, ADCs 428 and 430 may be sigma-delta ADCs. Digital filters 432 and 434 may be used to filter the output of the sigma-delta ADCs. In embodiments, digital filters 432 and 434 may be cascade integrator-comb filters.

Sensor 400 may also include various signal processing and tuning circuits such as filter 436, division circuit 438, offset/gain correction circuit 440 coupled to temperature sensing circuit 441 to adjust gain based on the temperature of the sensor, bandwidth selection circuit 442 to select an output bandwidth and/or latency, and segmented linearization circuit 444. These circuits filter and shape the output signal 444a of sensor 400.

Figure 5A:
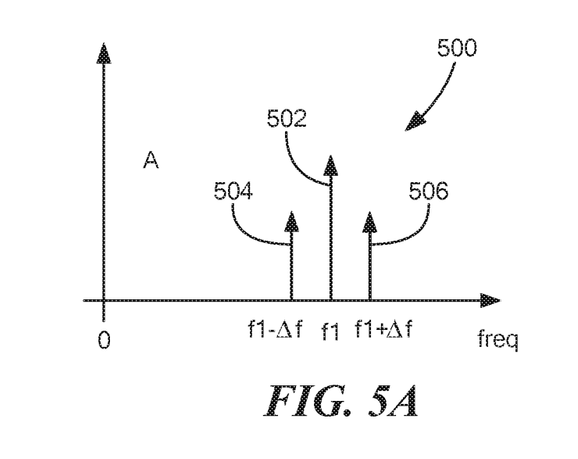
FIG. 5A, FIG. 5B, and FIG. 5C are frequency spectrum graphs of signals associated with the magnetic field sensor of FIG. 4.

Filter 436 may be a low pass filter to remove noise and other unwanted frequency components from the output of sensor 400. As noted, the signal component at frequency $\Delta f$ may represent the directly coupled magnetic field produced by coil 404. In embodiments, because the directly coupled magnetic field and the signal component at frequency $\Delta f$ may be a diagnostic component used to test and verify the operation of sensor 400, filter 436 may be configured to filter the signal component at frequency $\Delta f$ from the output. Thus, filter 436 may pass the frequency components at or near zero Hz representing reflected magnetic field and filter the frequency components at $\Delta f$ representing the diagnostic field produced by coil 404. This will be discussed further below in relation to FIG. 5.

Sensor 400 may also include a diagnostic signal processing path comprising modulators 446 and 448, filter 450, and diagnostic monitoring circuit 452. Modulators 446 and 448 may receive signals 432a and 434a and modulate them at frequency $\Delta f$ (i.e. the frequency of the directly coupled magnetic field produced by coil 404). This may shift the frequency components of the signals at frequency $\Delta f$ to approximately zero Hz, and shift other frequency components of the signals to higher frequencies. For example, the zero-frequency component of signals 432a and 434a (which represents the reflected magnetic field induced by coil 402), may be shifted to a higher frequency.

Filter 450 may be a low pass filter configured to pass the zero-frequency component of the signal representing the diagnostic magnetic field (referred to herein as the diagnostic signal) and filter higher frequency components of the signal, such as the frequency components representing the reflected magnetic field induced by coil 402 (e.g. at f1).

Diagnostic monitoring circuit 452 may be a circuit configured to continuously or periodically compare the diagnostic signal to an expected value. If the diagnostic signal falls outside a predetermined threshold around the expected value, diagnostic monitoring circuit 452 may generate an error signal 453 indicating that sensor 400 may be malfunctioning, operating inaccurately, etc. Diagnostic monitoring circuit 452 may comprise one or more comparator circuits to determine whether the amplitude of the diagnostic signal is above a safety threshold and/or below a safety threshold. The threshold values may be expected values for the diagnostic signal based on the known value of the diagnostic magnetic field produced by coil 404. In this example, magnetic field sensor 400 may provide test coverage for various elements as shown in FIG. 4 including, but not necessarily limited to, magnetic field sensing elements 406, 408; amplifiers 418, 420; and ADCs 428, 430.

Using different frequencies f1 for the reflected magnetic field (which provides information about the target to be detected by sensor 400) and f2 for the diagnostic magnetic field (i.e. the directly-coupled magnetic field produced by coil 404) may allow magnetic field sensor 400 to process both the reflected magnetic field and the diagnostic magnetic field simultaneously. Thus, magnetic field sensor 400 may process the reflected magnetic field without interruption, while also processing diagnostic information to ensure that it is working properly.

In embodiments, the various elements shown in FIG. 4 can be rearranged and reordered so long as the signal(s) produced by magnetic field sensing elements 406, 408 can be modulated and/or demodulated at frequency f1 to isolate the frequency components related to the detected reflected field and at frequency f2 to isolate the frequency components related to the diagnostic magnetic field produced by coil 404.

Referring to FIG. 5A, a frequency spectrum graph 500 shows frequency components of signals 406a and 408a. The horizontal axis represents frequency (in arbitrary units) and the vertical axis represents amplitude (in arbitrary units). For example, the vertical axis may represent the voltage of signals 406a and/or 408a.

Frequency spike 502 may represent the reflected field induced in the target by coil 502 and detected by magnetic field sensing elements 406 and 408. Frequency spike 502 may represent the target detected by magnetic field sensor 400. Frequency spikes 504 and 506 may represent the diagnostic magnetic field generated by coil 404.

Figure 5B:
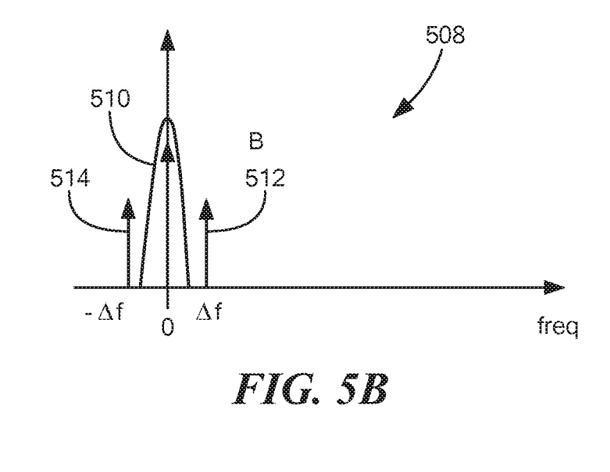

FIG. 5B is a frequency spectrum graph 508 showing frequency components of signals 422a and 426a, after the signals have been modulated by modulators 422 and 426 at frequency f1 respectively. Modulating the signals at frequency f1 shifts the frequency component at frequency f1 to zero Hertz, as shown by frequency spike 510. The modulation may also shift the frequency components f2 about the zero-frequency axis, thus leaving frequency spikes Δf and −Δf, as shown by frequency spikes 512 and 514. In embodiments, filter 436 may be a low pass filter configured to filter spikes 512 and 514 and pass frequency spike 510. Thus, the output of filter 436 may represent only the reflected magnetic field from the target and not the diagnostic field.

Figure 5C:
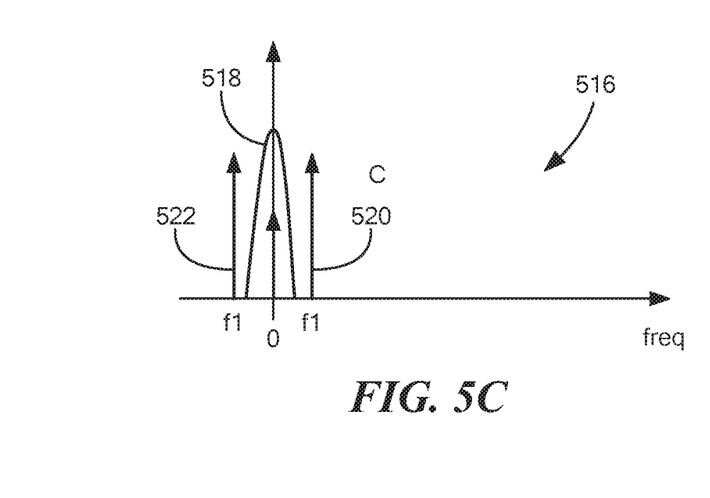

FIG. 5C is a frequency spectrum graph 516 showing frequency components of signals 446a and 448a, after the signals have been modulated by respective modulators 446 and 448 at frequency f2. Modulating the signals at frequency f2 shifts the frequency component at frequency f2 (i.e. the frequency component representing the diagnostic magnetic field) to zero Hertz, as shown by frequency spike 518. The modulation may also shift the frequency components f1 about the zero-frequency axis, as shown by frequency spikes 520 and 522. In embodiments, filter 450 may be a low pass filter configured to filter spikes 520 and 522 and pass frequency spike 518. Thus, the output of filter 450 may represent only the diagnostic magnetic field generated by coil 404 not the reflected magnetic field induced by coil 402.

Figure 6:
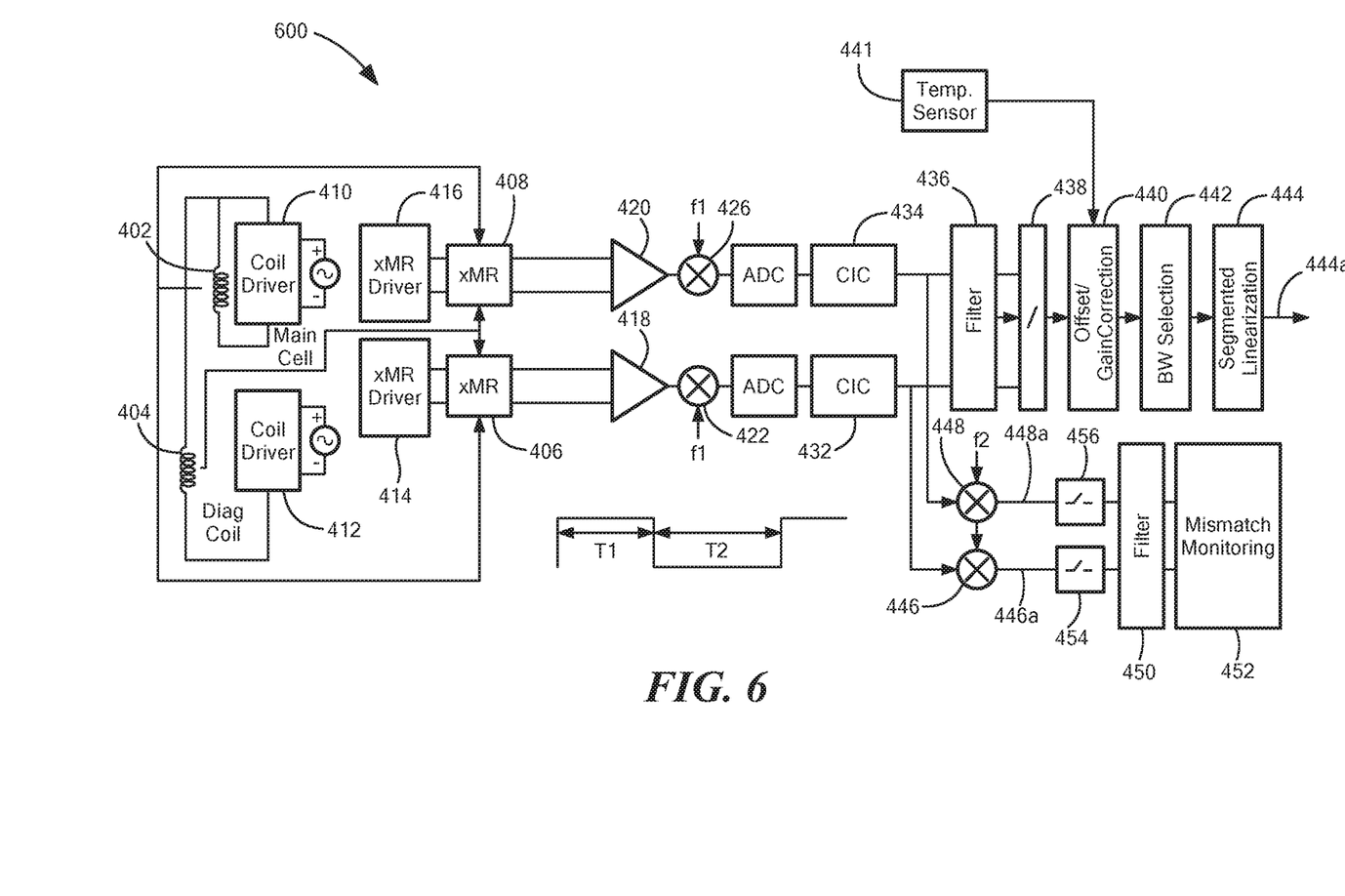
FIG. 6 is a block diagram of another embodiment of a magnetic field sensor including self-diagnostic circuitry.

Referring to FIG. 6, magnetic field sensor 600 may be similar to magnetic field sensor 400 and may include many of the same components and signals described above. However, magnetic field sensor 600 may continuously process the reflected field produce by coil 402, but may sample and process the diagnostic magnetic field generated by coil 404 only during a diagnostic time period T2. In other words, magnetic field sensor 600 may process the reflected field during time period T1 and T2, and may process the diagnostic magnetic field only during time period T2. Accordingly, sensor 600 may include sampling circuits 454 and 456 configured to sample signals 446a and 448a during diagnostic time period T2.

During time period T1, some or all of the circuits that process the diagnostic signal may be idle or powered down. These may include coil driver 412, modulators 446 and 448, filter 450, and diagnostic monitoring circuit 452. Idling or powering down these circuit elements may reduce power consumption.

Figure 7:
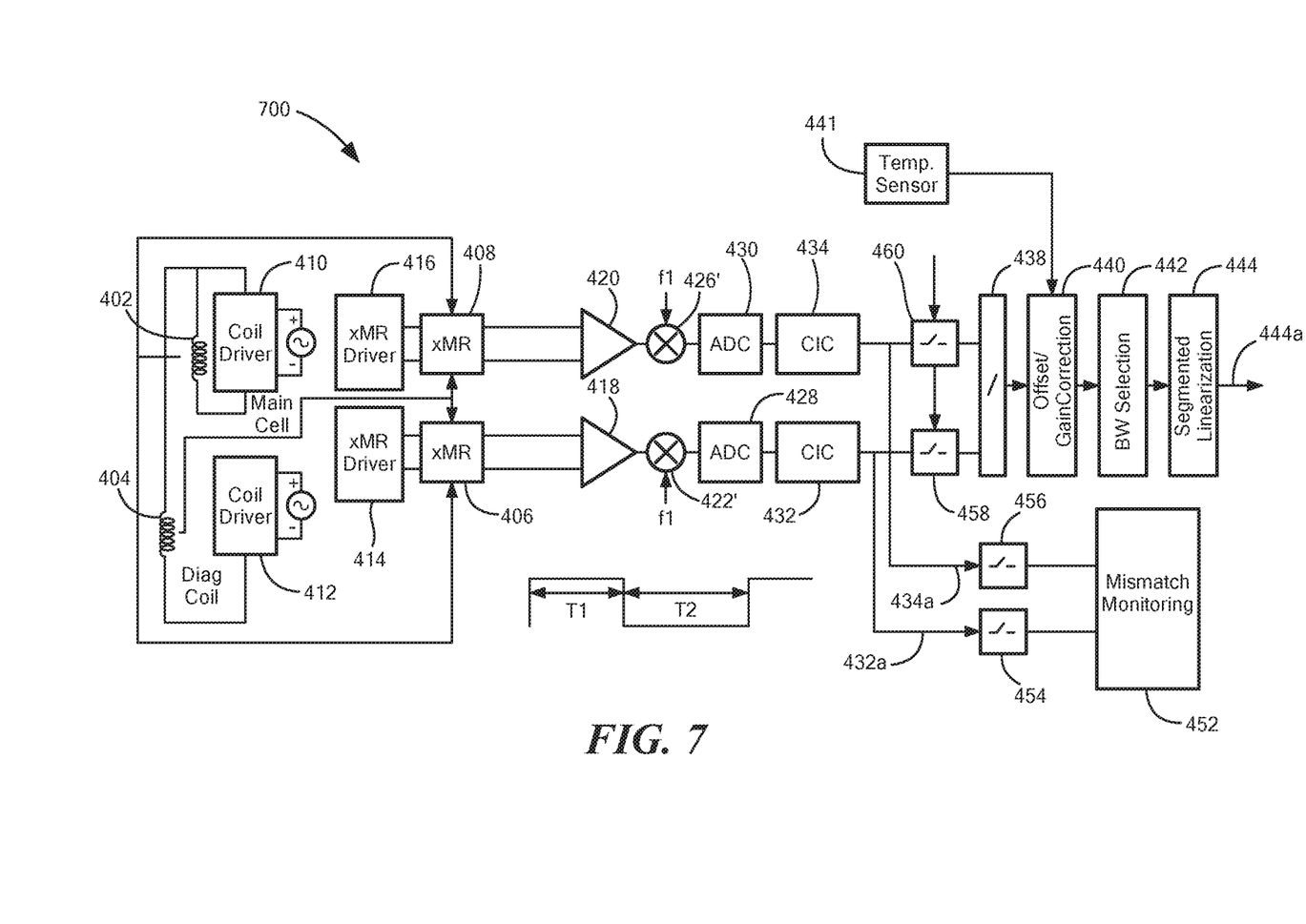
FIG. 7 is a block diagram of another embodiment of a magnetic field sensor including self-diagnostic circuitry.

Referring to FIG. 7, magnetic field sensor 700 may be similar to magnetic field sensor 400 and may include many of the same components and signals described above. However, magnetic field sensor 700 may employ time-division multiplexing to sample and process the reflected field induced by coil 402 during time period T1 and not during time period T2, and sample and process the diagnostic magnetic field generated by coil 404 during time period T2 and not during time period T1.

During time period T1, coil driver 410 may drive coil 402 to induce the reflected field and coil driver 412 may be deactivated so that coil 404 does not generate the diagnostic magnetic field. As a result, during time period T1 signals 432a and 434a contain frequency components representing the reflected field from the target and do not contain frequency components representing the diagnostic field generated by coil 404. Accordingly, sensor 700 may include sampling circuits 458 and 460 configured to sample respective signals 432a and 434a during time period T1 and direct the sampled signal to the output 444a.

During time period T2, coil driver 412 may drive coil 404 to generate the diagnostic magnetic field and coil driver 410 may be deactivated so that coil 402 does not induce the reflected magnetic field from the target. As a result, during time period T2 signals 432a and 434a contain frequency components representing the diagnostic field generated by coil 404 and do not contain frequency components representing the reflected field from the target. Accordingly, sensor 700 may include sampling circuits 454 and 456 configured to sample respective signals 432a and 434a during time period T2 and direct the sampled signal to diagnostic monitoring circuit 452.

In this example, filters 436 and 450 may not be necessary because the signal never contains both a frequency component representing the reflected field from the target and a frequency component representing the diagnostic field generated by coil 404. Additionally, modulators 422' and 426' may be configured to modulate the signals at frequency f1 (the frequency of coil driver 410) during time period T1 and modulate the signals at frequency f2 (the frequency of coil driver 412) during time period T2. Because the signals are time-division multiplexed in this example, frequency f1 and f2 may be the same frequency or different frequencies. If they are the same frequency, modulators 422' and 426' need to modulate the signals at only a single frequency.

The embodiments described above serve to illustrate various concepts, structures and techniques. The should not be construed to limit the scope of this patent. Other embodiments incorporating these concepts, structures and techniques may be used. The scope of the patent should be limited only by the spirit and scope of the following claims.

All references cited in this patent are incorporated here by reference in their entirety.

The invention claimed is:

1. A magnetic field sensor comprising:
  a first coil configured to generate a magnetic field having a first frequency, wherein the magnetic field induces a reflected magnetic field from a target;

a second coil configured to generate a diagnostic magnetic field having a second frequency different than the first frequency, wherein the diagnostic magnetic field is configured not to induce a reflected magnetic field from the target that is measurable by the magnetic field sensor;

at least two magnetic field sensing elements to detect the reflected magnetic field and the diagnostic magnetic field and to generate a signal that simultaneously represents the reflected magnetic field and the diagnostic magnetic field; and a processing circuit coupled to the at least two magnetic field sensing elements and configured to: receive the signal; extract a diagnostic magnetic field portion of the signal representing the diagnostic magnetic field; and generate an error signal if the diagnostic magnetic field portion of the signal represents a fault.

2. The magnetic field sensor of claim 1 further comprising a demodulator circuit to demodulate the signal at the first frequency to produce a demodulated signal representing the reflected magnetic field and the diagnostic magnetic field.

3. The magnetic field sensor of claim 2 wherein a portion of the demodulated signal representing the reflected magnetic field is centered at about zero Hertz.

4. The magnetic field sensor of claim 2 further comprising a filter to remove a portion of the demodulated signal representing the diagnostic magnetic field and produce a signal representing the reflected magnetic field.

5. The magnetic field sensor of claim 4 wherein the filter is a low pass filter configured to pass a portion of the demodulated signal representing the reflected magnetic field and filter the portion of the demodulated signal representing the diagnostic magnetic field.

6. The magnetic field sensor of claim 1 further comprising a demodulator circuit to demodulate the signal at the second frequency to produce a demodulated signal representing the reflected magnetic field and the diagnostic magnetic field.

7. The magnetic field sensor of claim 6 wherein a portion of the demodulated signal representing the reflected magnetic field is centered at about zero Hertz.

8. The magnetic field sensor of claim 6 further comprising a filter to remove a portion of the demodulated signal representing the reflected magnetic field and produce a signal representing the diagnostic magnetic field.

9. The magnetic field sensor of claim 1 wherein the processing circuit further comprises an analog-to-digital converter to convert the signal to a digital signal.

10. The magnetic field sensor of claim 1 wherein the processing circuit comprises a comparator circuit configured to compare an amplitude of the extracted diagnostic magnetic field portion of the signal to a predetermined threshold value.

11. The magnetic field sensor of claim 10 wherein the processing circuit is configured to generate the error signal if the extracted diagnostic magnetic field portion of the signal falls outside the predetermined threshold value.

12. The magnetic field sensor of claim 1 wherein the second coil comprises a first lobe and a second lobe.

13. The magnetic field sensor of claim 12 wherein the first and second lobes are supported on a same substrate.

14. The magnetic field sensor of claim 12 wherein the first and second lobes each comprise a first winding portion having a first winding direction and a second winding portion having a second winding direction that is opposite to the first winding direction.

15. The magnetic field sensor of claim 14 wherein at least one of the magnetic field sensing elements is positioned between the first and second winding portions of the first lobe and at least one of the magnetic field sensing elements is positioned between the first and second winding portions of the second lobe.

16. The magnetic field sensor of claim 14 wherein the first and second winding portions produce canceling magnetic fields so that the second coil does not induce a reflected magnetic field from the target.

17. The magnetic field sensor of claim 1 wherein the second frequency is selected so that the second coil does not induce a reflected magnetic field from the target.

18. The magnetic field sensor of claim 1 wherein the at least two magnetic field sensing elements comprise one or more of a Hall effect element, a giant magnetoresistance (MR) element, an anisotropic magnetoresistance (AMR) element, a tunneling magnetoresistance (TMR) element, or a magnetic tunnel junction (MTJ) element.

19. The magnetic field sensor of claim 1 further comprising one or more coil driver circuits configured to energize the first coil to produce the magnetic field during a first time period and to energize the second coil to produce the diagnostic magnetic field during a second time period.

20. A magnetic field sensor comprising:
a coil configured to generate a magnetic field having a first frequency, wherein the magnetic field induces a reflected magnetic field from a target;
means for generating a diagnostic magnetic field having a second frequency different than the first frequency, wherein the diagnostic magnetic field does not induce a reflected magnetic field from the target that is measurable by the magnetic field sensor;
means for detecting the reflected magnetic field and the diagnostic magnetic field and generating a signal that simultaneously represents the reflected magnetic field and the diagnostic magnetic field; and
means for extracting a portion of the signal representing the diagnostic magnetic field.

21. A magnetic field sensor comprising:
a first coil configured to generate a magnetic field having a first frequency, wherein the magnetic field induces a reflected magnetic field from a target;
a second coil configured to generate a diagnostic magnetic field having a second frequency, the second coil including a first lobe and a second lobe, the first and second lobes each including a first winding portion having a first winding direction and a second winding portion having a second winding direction that is opposite to the first winding direction;
at least two magnetic field sensing elements to detect the reflected magnetic field and the diagnostic magnetic field and to generate a signal representing the reflected magnetic field and the diagnostic magnetic field, at least one of the magnetic field sensing elements being positioned between the first and second winding portions of the first lobe, and at least one of the magnetic field sensing elements being positioned between the first and second winding portions of the second lobe; and
a processing circuit coupled to the at least two magnetic field sensing elements and configured to: receive the signal; extract a diagnostic magnetic field portion of the signal representing the diagnostic magnetic field; and generate an error signal if the diagnostic magnetic field portion of the signal represents a fault.

22. A magnetic field sensor comprising:
- a first coil configured to generate a magnetic field having a first frequency, wherein the magnetic field induces a reflected magnetic field from a target;
- a second coil configured to generate a diagnostic magnetic field having a second frequency, the second coil including a first lobe and a second lobe, the first and second lobes each including a first winding portion having a first winding direction and a second winding portion having a second winding direction that is opposite to the first winding direction;
- at least two magnetic field sensing elements to detect the reflected magnetic field and the diagnostic magnetic field and to generate a signal representing the reflected magnetic field and the diagnostic magnetic field; and
- a processing circuit coupled to the at least two magnetic field sensing elements and configured to: receive the signal; extract a diagnostic magnetic field portion of the signal representing the diagnostic magnetic field; and generate an error signal if the diagnostic magnetic field portion of the signal represents a fault,
- wherein the first and second winding portions produce canceling magnetic fields so that the second coil does not induce a reflected magnetic field from the target.

* * * * *

UNITED STATES PATENT AND TRADEMARK OFFICE
CERTIFICATE OF CORRECTION

PATENT NO. : 11,143,732 B2
APPLICATION NO. : 15/901135
DATED : October 12, 2021
INVENTOR(S) : Hernán D. Romero et al.

It is certified that error appears in the above-identified patent and that said Letters Patent is hereby corrected as shown below:

In the Specification

Column 5, Line 44 delete "components" and replace with --component--.

Column 5, Line 47 delete ", frequency" and replace with --, frequencies--.

Column 7, Line 62 delete "produce" and replace with --produced--.

Column 7, Line 66 delete "period" and replace with --periods--.

Column 8, Line 22 delete "T1 signals" and replace with --T1, signals--.

Column 8, Line 34 delete "T2 signals" and replace with --T2, signals--.

Column 8, Line 51 delete ", frequency" and replace with --, frequencies--.

Column 8, Line 56 delete ". The" and replace with --. They--.

Signed and Sealed this
Twenty-fifth Day of October, 2022

Katherine Kelly Vidal
*Director of the United States Patent and Trademark Office*